(12) United States Patent
Von Ammon et al.

(10) Patent No.: US 6,350,314 B1
(45) Date of Patent: Feb. 26, 2002

(54) PROCESS FOR PRODUCING NITROGEN-DOPED SEMICONDUCTOR WAFERS

(75) Inventors: Wilfried Von Ammon, Hochburg/Ach (AT); Herbert Weidner, Haiming (DE); Dirk Zemke, Marktl (DE); Christoph Frey, Burghausen (DE)

(73) Assignee: Wacker Siltronic Gesellschaft für Halbleitermaterialien AG, Burghausen (DE)

( * ) Notice: Subject to any disclaimer, the term of this patent is extended or adjusted under 35 U.S.C. 154(b) by 0 days.

(21) Appl. No.: 09/652,443

(22) Filed: Aug. 31, 2000

(30) Foreign Application Priority Data

Sep. 2, 1999  (DE) .......................................... 199 41 902

(51) Int. Cl.$^7$ ............................................... G30B 15/04
(52) U.S. Cl. .............................. 117/19; 117/66; 117/73; 117/76; 117/916; 117/930
(58) Field of Search ................................ 117/2, 19, 66, 117/73, 76, 916, 930, 932

(56) References Cited

U.S. PATENT DOCUMENTS

| 4,591,409 A | 5/1986 | Ziem et al. |
| 5,935,320 A | 8/1999 | Graef et al. |
| 6,191,009 B1 * | 2/2001 | Tamatsuka et al. ......... 438/471 |

FOREIGN PATENT DOCUMENTS

| EP | 0 170 788 | 2/1986 |
| EP | 0284107 | 9/1988 |
| EP | 0 829 559 | 3/1998 |

OTHER PUBLICATIONS

W. Kaiser, C.D. Thurmond, J. Appl. Phys. 30, No. 3, 427–431 (1959).

W. Kaiser, Nitrogen in Silicon, Journal of Applied Physics, vol. 30, No. 3, p. 427–431.

* cited by examiner

Primary Examiner—Felisa Hiteshew
(74) Attorney, Agent, or Firm—Collard & Roe, P.C.

(57) ABSTRACT

A process for producing nitrogen-doped semiconductor wafers has the nitrogen being derived from a dopant gas which contains $NH_3$. The process includes pulling a single crystal from a melt of molten semiconductor material, feeding the dopant gas to the semiconductor material, and cutting the nitrogen-doped semiconductor wafers off the pulled single crystal. The dopant gas is fed to the semiconductor material at most until pulling begins for that part of the single crystal from which the semiconductor wafers are cut.

12 Claims, No Drawings

PROCESS FOR PRODUCING NITROGEN-DOPED SEMICONDUCTOR WAFERS

BACKGROUND OF THE INVENTION

1. Field of the Invention

The present invention relates to a process for producing nitrogen-doped semiconductor wafers, with the nitrogen being derived from a dopant gas which contains $NH_3$. The process comprises the steps of pulling the single crystal from a melt of molten semiconductor material and cutting the nitrogen-doped semiconductor wafers off the pulled single crystal.

2. The Prior Art

It is known to cut semiconductor wafers off a single crystal. The single crystal is obtained by zone refining (floating zone method, or FZ method) or by pulling from a molten material which is contained in a crucible (Czochralski method, or CZ method). U.S. Pat. No. 4,591,409 has described a process which achieves a uniform distribution of nitrogen in a single crystal which has been pulled using the CZ method. According to this process, it is necessary to ensure the presence of a gas, such as dinitrogen oxide, during the pulling operation.

A scientific article reports experiments involving reacting nitrogen gas or a gas mixture of helium and $NH_3$ with molten silicon (W. Kaiser, C. D. Thurmond, *J.Appl.Phys.* 30, No. 3, 427–431 (1959)). However, the article does not contain any teaching as to how semiconductor wafers can be reproduced which contain nitrogen in a predetermined concentration and with a uniform distribution. Due to the thermal instability of $NH_3$, reproducible doping cannot be achieved without suitable measures.

SUMMARY OF THE INVENTION

The present invention relates to a process for producing nitrogen-doped semiconductor wafers, comprising the steps of pulling a single crystal from a melt of molten semiconductor material; feeding a dopant gas which contains $NH_3$ to the semiconductor material whereby nitrogen is derived from said dopant gas; feeding the dopant gas to the semiconductor material at most until pulling begins for that part of the single crystal from which the semiconductor wafers are cut; and cutting the nitrogen-doped semiconductor wafers off the pulled single crystal.

Compared to the process described in U.S. Pat. No. 4,591,409, this process of the present invention has the advantage that the axial distribution of nitrogen in the single crystal is more uniform. That is the axial gradient of the nitrogen concentration in the single crystal is less pronounced. Furthermore, the process prevents oxygen derived from the dopant gas from corroding graphite-containing internal surfaces or structures in the pulling apparatus, forming CO and, consequently, contaminating the semiconductor material with carbon.

According to the invention, a dopant gas is fed to the semiconductor material during the pulling of the single crystal in a pulling apparatus at most until that part of the single crystal is pulled which is intended to be processed further to form semiconductor wafers. This part of the single crystal is the entire, or at least virtually the entire, part of the single crystal which is of cylindrical shape. The conical parts which adjoin this cylindrical part are preferably not processed further to form semiconductor wafers. After the feed of dopant gas to the semiconductor material has been terminated, the pulling of the single crystal is completed in the usual way, for example in a pure inert gas atmosphere.

If pulling is carried out using the CZ method, the feed of dopant gas to the semiconductor material should preferably be commenced at the earliest when the semiconductor material contained in a crucible has melted completely. If pulling is carried out using the FZ method, the feed of dopant gas to the semiconductor material should be commenced at the earliest when the pulling of a so-called thin neck has already commenced. Preferably the feed of dopant gas should begin when the pulling of the thin neck has ended and an initial cone is being pulled using the FZ method. In this case, the feed of dopant gas to the semiconductor material is preferably ended before the pulling of the cylindrical section of the single crystal has commenced.

The dopant gas is passed through the pulling apparatus at a defined flow rate and with a defined concentration of $NH_3$ for a defined time. Preferably, the dopant gas is fed to the semiconductor material in the cooled state. It is also preferable for the flow of dopant gas to be passed to the open surface of the molten semiconductor material. For example, the flow of gas can be fed through a cooled tube (in particular in the case of the FZ method) or through a heat shield surrounding the single crystal which is to be pulled (in particular in the case of the CZ method), close to the open surface of the molten material. Furthermore, in the case of the CZ method it is preferable, in order to achieve an axially uniform distribution of nitrogen in the single crystal, if the single crystal is pulled in a magnetic field, the field lines of which are axially oriented.

It has been established that the presence of an excessively high concentration of nitrogen in the molten material can prevent a single crystal from growing and that nitrogen which is dissolved in the molten material in practice can no longer escape from the molten material. Therefore, it is particularly preferable for the concentration of nitrogen in the single crystal not to be allowed to increase beyond a limit amount of $5*10^{15}$ atoms/cm$^3$, preferably not beyond $3*10^{15}$ atoms/cm$^3$. Accordingly, the flow rate of dopant gas through the pulling chamber, and the concentration of $NH_3$ in the dopant gas, and the time for which the dopant gas is fed to the semiconductor material are to be selected in such a way that wherever possible the limit amount is not exceeded. Typically, for example, to pull a single crystal with a weight of from 30 to 120 kg using the CZ method, a total quantity of from 0.01 to 20 liters (s.t.p.), preferably from 0.1 to 3 liters (s.t.p.) of $NH_3$ should be sufficient. This is because given an effective feed of gas directed toward the surface of the molten material, nitrogen is absorbed by the semiconductor material from approximately 25% to 50% by volume of the $NH_3$ supplied. If the gas is fed less effectively, the amount of dopant gas required increases accordingly.

The dopant gas provided is an $NH_3$-containing gas, preferably a mixture of $NH_3$ and an inert gas, particularly preferably an $NH_3$/argon mixture. The semiconductor material can be either silicon or germanium, and preferably is silicon.

A single crystal which is produced in the manner described above is divided into semiconductor wafers of the desired thickness in a known way, for example using a wire saw or an annular saw. Usually, only that part of the single crystal which is substantially cylindrical is completely or partially divided into semiconductor wafers.

The present invention will now be further illustrated by reference to the following Example which is not to be deemed limitative of the present invention in any manner thereof.

DETAILED DESCRIPTION OF PREFERRED EMBODIMENT

Example

A silicon single crystal with a diameter of 200 mm was pulled using the CZ method. Before the phase of cylindrical growth of the silicon single crystal commenced, a gas mixture of 0.2% $NH_3$ and the balance being argon was passed over the molten silicon material at a flow rate through the pulling chamber of 3.6 l/min for 60 minutes. When the cylindrical growth phase commenced, the pulling chamber was only then purged with argon. A subsequent examination of the silicon single crystal revealed a nitrogen concentration of about $1*10^{14}$ atoms/cm$^3$ in the area of that part of the single crystal which adjoins the seed crystal. There was a nitrogen concentration which rises only in accordance with the segregation coefficient of about $10^{-3}$ toward the end of this part of the single crystal.

Accordingly, while a few embodiments of the present invention have been shown and described, it is to be understood that many changes and modifications may be made thereunto without departing from the spirit and scope of the invention as defined in the appended claims.

What is claimed is:

1. A process for producing a nitrogen-doped semiconductor wafer, comprising the steps of pulling a single crystal from a melt of molten semiconductor material, and feeding a dopant gas which contains $NH_3$ to the semiconductor material, whereby nitrogen is derived from said dopant gas;

feeding the dopant gas to the semiconductor material at most until pulling begins for that part of the single crystal from which semiconductor wafers are cut; and cutting the nitrogen-doped semiconductor wafers off the pulled single crystal.

2. The process as claimed in claim 1, comprising passing the dopant gas through a pulling chamber; and setting a flow rate of the dopant gas through the pulling chamber and a concentration of $NH_3$ in the dopant gas in such a way that the concentration of nitrogen with which the semiconductor wafers are doped is at most $5*10^{15}$ atoms/cm$^3$.

3. The process as claimed in claim 1, wherein the amount of $NH_3$ which is fed to the semiconductor material for pulling a single crystal with a weight of from 30 kg to 120 kg using the CZ method is from 0.01 to 20 liters (s.t.p.).

4. The process as claimed in claim 1, comprising pulling the single crystal using the CZ method; and commencing the feeding of the dopant gas to the semiconductor material at the earliest when the semiconductor material contained in a crucible has melted.

5. The process as claimed in claim 1, comprising pulling the single crystal using the CZ method in an axially oriented magnetic field.

6. The process as claimed in claim 1, comprising pulling the single crystal using the FZ method;

commencing the feeding of the dopant gas to the semiconductor material at the earliest once pulling of a thin neck has commenced; and ending the feeding of the dopant gas at the latest before the pulling of a cylindrical section of the single crystal has commenced.

7. The process as claimed in claim 1, comprising passing a gas mixture which contains $NH_3$ and argon through a pulling chamber as the dopant gas.

8. The process as claimed in claim 1, comprising cooling the dopant gas; and feeding the dopant gas to the semiconductor material in a cooled state.

9. The process as claimed in claim 1, comprising passing the dopant gas closely over an open, molten surface of the semiconductor material.

10. The process as claimed in claim 1, wherein the semiconductor material is selected from the group consisting of silicon and germanium.

11. The process as claimed in claim 10, wherein the semiconductor material is silicon.

12. The process as claimed in claim 10, wherein the semiconductor material is germanium.

* * * * *